United States Patent
Perumal

[11] Patent Number: 5,986,922
[45] Date of Patent: Nov. 16, 1999

[54] METHOD OF AND APPARATUS FOR INCREASING LOAD RESISTANCE WITHIN AN SRAM ARRAY

[75] Inventor: Ratnam Perumal, Fremont, Calif.

[73] Assignee: Alliance Semiconductor, San Jose, Calif.

[21] Appl. No.: 08/941,582

[22] Filed: Sep. 30, 1997

[51] Int. Cl.⁶ .................................................. G11C 11/00
[52] U.S. Cl. .......................................... 365/154; 257/380
[58] Field of Search ............................. 365/154; 357/41; 257/487, 536, 538, 904, 380

[56] References Cited

U.S. PATENT DOCUMENTS

| | | | |
|---|---|---|---|
| 4,169,291 | 9/1979 | Rossler | 365/185 |
| 4,328,565 | 5/1982 | Harari | 365/185 |
| 4,554,644 | 11/1985 | Chen et al. | 365/154 |
| 4,631,705 | 12/1986 | Honda | 365/182 |
| 4,698,787 | 10/1987 | Mukherjee et al. | 365/185 |
| 4,713,677 | 12/1987 | Tigelaar et al. | 357/23.5 |
| 5,005,068 | 4/1991 | Ikeda et al. | 357/59 |
| 5,093,706 | 3/1992 | Mitsuhashi et al. | 357/41 |
| 5,143,860 | 9/1992 | Mitchell et al. | 437/43 |
| 5,172,211 | 12/1992 | Godinho et al. | 257/536 |
| 5,241,206 | 8/1993 | Lee et al. | 257/380 |
| 5,294,825 | 3/1994 | Nakagawa et al. | 257/487 |
| 5,343,063 | 8/1994 | Yuan et al. | 257/317 |
| 5,378,643 | 1/1995 | Ajika et al. | 437/43 |
| 5,382,540 | 1/1995 | Sharma et al. | 437/52 |
| 5,521,860 | 5/1996 | Ohkubo | 365/154 |

*Primary Examiner*—David Nelms
*Assistant Examiner*—David Lam
*Attorney, Agent, or Firm*—Haverstock & Owens LLP

[57] ABSTRACT

An SRAM array includes resistive loads. These loads are made from resistance sheets formed over polysilicon rails which have vertically extending sidewalls relative to the substrate. The polysilicon rails form vertical area enhancing structures over which the resistance sheets are formed. The resistance sheets include substantially vertical components and substantially horizontal components. The resistance sheets are patterned to form current limiting devices within memory cells of the SRAM array. The polysilicon rails are deposited onto the substrate. Alternatively, the polysilicon rails are deposited onto a field oxide layer of the substrate. An oxide layer is then formed over the polysilicon rails. A second polysilicon layer is formed over the oxide layer, thereby forming the resistance sheet. The resistance sheet has a greater effective length, including the length of the vertical and horizontal components, than the length within which the resistance sheet is contained. Due to this greater effective length, the resistance sheet has a greater L/W ratio, than a conventional resistance sheet within the same area, thereby achieving a greater resistive value for the current limiting devices without increasing the overall dimensions of the SRAM array.

21 Claims, 3 Drawing Sheets

METHOD OF AND APPARATUS FOR INCREASING LOAD RESISTANCE WITHIN AN SRAM ARRAY

FIELD OF THE INVENTION

The present invention relates to the field of semiconductor memory devices. More particularly, the present invention relates to the field of fabricating a static random access memory (SRAM) integrated circuit device.

BACKGROUND OF THE INVENTION

Static random access memories (SRAMs) typically include one or more arrays of memory cells, with each cell including a pair of cross-coupled active storage devices. The storage devices are typically transistors, for example insulated gate field effect transistors (referred to herein as "MOS" transistors). Each cross-coupled pair of transistors is disposed between opposite power supply nodes and can be latched in one of two states depending upon which of the two storage devices is turned on. The cross-coupled arrangement results in complementary signals at two data nodes, both (or one) of which can be read by a pair of bit lines (or single bit line) by another pair of access active devices. The access devices are usually driven by a word line. Commonly, in addition to the two cross-coupled storage devices and two access devices, current limiting devices are also provided to reduce the amount of current consumed by the "on" storage device. A current limiting device is situated between each storage device and one of the power supply nodes. This SRAM cell approach, as described, has given rise to "four transistor" (4-T) memory cells and "six transistor" (6-T) memory cells. In the case of 4-T cells, the current limiting devices are typically resistors.

For 6-T cells, the current limiting devices are typically another pair of active devices.

The memory cells of conventional SRAM arrays are arranged in rows and columns. Cells within the same row have access devices driven by the same word line. Cells within the same column are coupled to the same bit lines. When a word line is activated, the access devices couple the data nodes to bit lines, which in turn, provide output data in a read operation, or are driven by write data in a write operation.

A schematic diagram of a prior art 4-T cell is illustrated in FIG. 1. The 4-T cell is designated by the general reference character 10. The N-channel MOS (NMOS) transistors T1 and T2 are cross-coupled storage devices that form a latching structure. The drains of the transistors T1 and T2 form complementary data nodes 12a and 12b. The data nodes 12a and 12b are coupled to the bit lines (not shown in FIG. 1) by the NMOS transistors T3 and T4. As is well-known in the art, the gates of the transistors T3 and T4 are commonly driven by a word line (not shown). The sources of the transistors T1 and T2 are commonly coupled to a first power supply, Vss (ground), while the data nodes 12a and 12b are coupled to a second power supply, Vcc, through the current limiting devices (resistors R1 and R2). It is desirable for the resistors R1 and R2 to have high impedances to limit power consumption.

As is well known in the art, the resistors R1 and R2 are typically fabricated from doped polysilicon when included within an integrated circuit. A graph of the resistivity of moderately doped polysilicon versus the concentration of the dopant is illustrated in FIG. 2. The curve 20 illustrates the relationship between the concentration of dopant within the polysilicon and the corresponding resistivity of the doped polysilicon. As illustrated by the curve 20, as the concentration of dopant is increased, the resistivity of the doped polysilicon decreases.

A high activation energy is required for a typical polysilicon resistance sheet with a high load resistance due to a lower concentration of dopant in the resistance sheet. This high activation energy causes problems at low temperatures. There is also a large variation in the sheet resistance of doped polysilicon due to fluctuations in the grain size, thereby limiting the manufacturability of devices. Because of these problems, the application of polysilicon loads is typically limited to a sheet resistance of approximately 500 Gohm/sq at room temperature. Accordingly, in order to provide a high load resistance for such polysilicon loads, it is required to use a sheet having a large length/width (L/W) ratio for a given thickness. However, the available area for such a sheet is generally fixed due to packaging, size, manufacturing and cost constraints.

In order to obtain a greater L/W ratio, the width of a resistance sheet cannot be arbitrarily reduced due to manufacturing requirements of conventional semiconductor processes as well as for current carrying capability of the resistance sheet. Accordingly, to increase the L/W ratio for a given resistance sheet, and thereby increase the load resistance of the resistance sheet, the length of the resistance sheet must typically be increased. This requires additional space on the silicon substrate and increases the overall die dimensions of an SRAM.

Another approach used to increase the load resistance of the resistance sheet is to lower the implant dose and thereby decrease the concentration of dopant within the resistance sheet. However, this approach requires a higher activation energy, as described above, and leads to manufacturability problems associated with control of the higher activation energy. It is typically preferred to employ a concentration of dopant of the resistance sheet for N-type silicon within the flat region of the curve 20, illustrated by the circle 22 of FIG. 2. Accordingly, in order to obtain a higher resistance value for a given resistance sheet having a fixed width and dopant concentration, the length of the resistance sheet must be increased.

A cross section of the length dimension of a conventional resistance sheet of polysilicon is illustrated in FIG. 3. This resistance sheet 30 is formed over a field oxide region 32 within a silicon substrate. An oxide layer 34 is deposited over the field oxide region 32. This oxide layer 34 is typically deposited by a chemical vapor deposition (CVD) process, as is well known in the art. A layer of doped polysilicon 38 is then formed over the oxide layer 34, thereby forming the resistance sheet. This layer of doped polysilicon 38 is used to form the resistors R1 and R2 in a conventional SRAM array.

As described above, for a given width of the resistance sheet 30 having a fixed dopant concentration, the resistance value of the resistance sheet 30 is dependent on the length of the resistance sheet 30. For a given width of the resistance sheet, the resistance value of the resistance sheet 30 can be increased by increasing the length of the resistance sheet and thereby increasing the L/W ratio of the resistance sheet. However, increasing the length of the resistance sheet 30, increases the overall dimensions of the SRAM array. As illustrated in FIG. 3, the length of the resistance sheet shown is 2.5 micrometers, yielding an effective length of 2.5 micrometers.

What is needed is an SRAM structure with an increased load resistance which does not require an increase of the activation energy or an increase in the necessary silicon area. What is further needed is a fabrication method for an SRAM which increases the load resistance of the resistors R1 and R2, without increasing the necessary activation energy or the necessary silicon area.

SUMMARY OF THE INVENTION

An SRAM array includes resistive loads. These loads are made from resistance sheets formed over polysilicon rails which have vertically extending sidewalls relative to the substrate. The polysilicon rails form vertical area enhancing structures over which the resistance sheets are formed. The resistance sheets include substantially vertical components and substantially horizontal components. The resistance sheets are patterned to form current limiting devices within memory cells of the SRAM array. The polysilicon rails are deposited onto the substrate. Alternatively, the polysilicon rails are deposited onto a field oxide layer of the substrate. An oxide layer is then formed over the polysilicon rails. A second polysilicon layer is formed over the oxide layer, thereby forming the resistance sheet. The resistance sheet has a greater effective length, including the length of the vertical and horizontal components, than the length within which the resistance sheet is contained. Due to this greater effective length, the resistance sheet has a greater L/W ratio, than a conventional resistance sheet within the same area, thereby achieving a greater resistive value for the current limiting devices without increasing the overall dimensions of the SRAM array.

DETAILED DESCRIPTION OF THE PREFERRED EMBODIMENT

Figure 4:
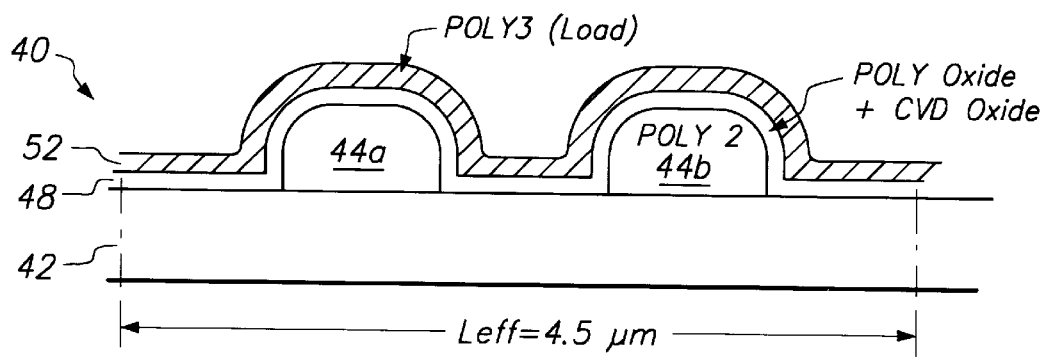
FIG. 4 illustrates a cross section of the length dimension of a resistance sheet of polysilicon of the preferred embodiment of the present invention.
Figure 5:
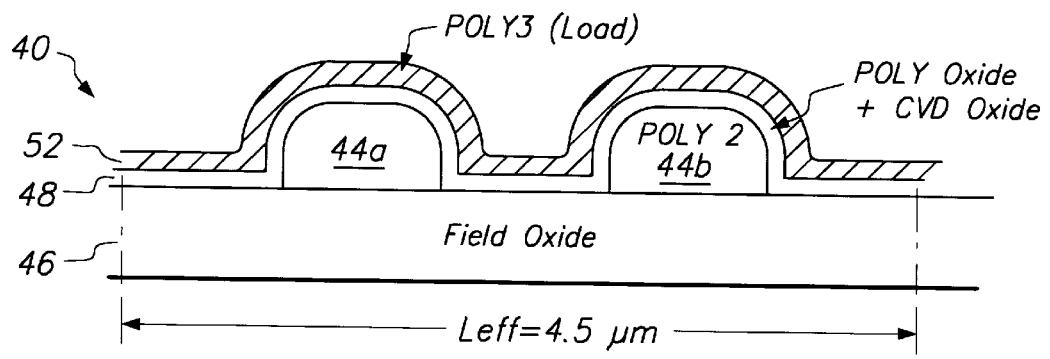
FIG. 5 illustrates a cross section of the length dimension of a resistance sheet of polysilicon of an alternate embodiment of the present invention.

An SRAM array of the present invention, includes a resistance sheet with an increased load resistance value due to an increase of the effective length of the resistance sheet without an increase in the overall dimensions of the SRAM circuit array. The preferred embodiment of the resistance sheet of the present invention, for use within an SRAM array, is illustrated in FIG. 4. Preferably, the resistance sheet 40 is formed over a silicon substrate 42. Alternatively, as illustrated in FIG. 5, the resistance sheet 40 is formed over a field oxide region 46 on a silicon substrate. Vertical area enhancing structural elements 44a and 44b, which are also herein referred to as poly 2 rails, have sidewalls which extend in a vertical direction away from the substrate 42. Preferably, the structural elements 44a and 44b are formed of polysilicon. An oxide layer 48 is then deposited over the structural elements 44a and 44b. This oxide layer 48 is deposited by a CVD process, as is well known in the art. A second layer of doped polysilicon 52 is then formed over the oxide layer 48 and patterned to form the resistance sheet. Doping of the second polysilicon layer 52 is governed by subsequent oxide growth, and can be done in situ, or by using ion implantation. The vertical regions of the second layer of polysilicon 52 are preferably doped by two way rotation of the implant. This second layer of doped polysilicon 52 is used to form the resistors R1 and R2 in an SRAM array.

Figure 1:
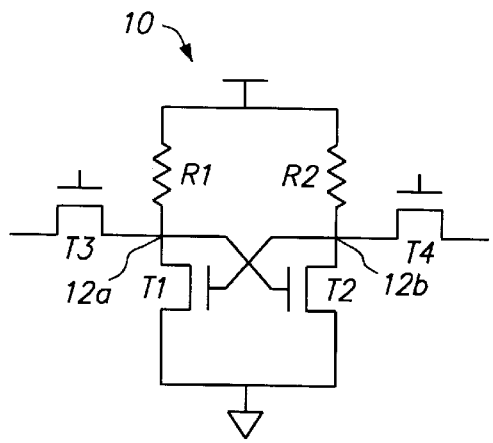
FIG. 1 illustrates a schematic diagram of a four transistor SRAM cell utilized in both the prior art and in the preferred embodiment of the present invention.
Figure 2:
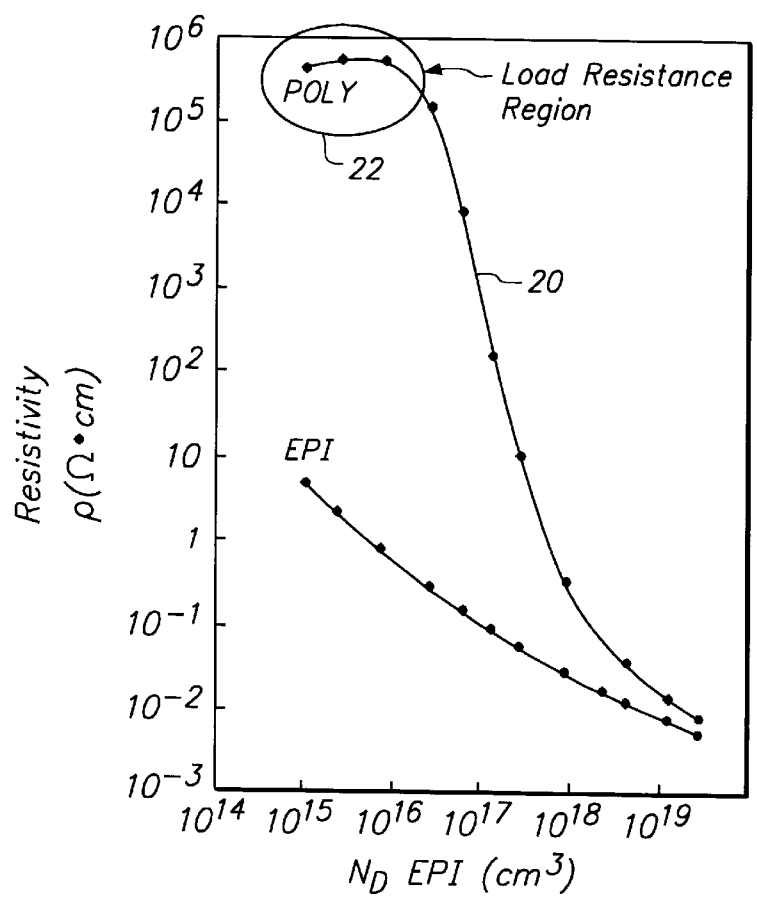
FIG. 2 illustrates a graph of the resistivity of moderately doped polysilicon versus the concentration of the dopant within the polysilicon.
Figure 3:
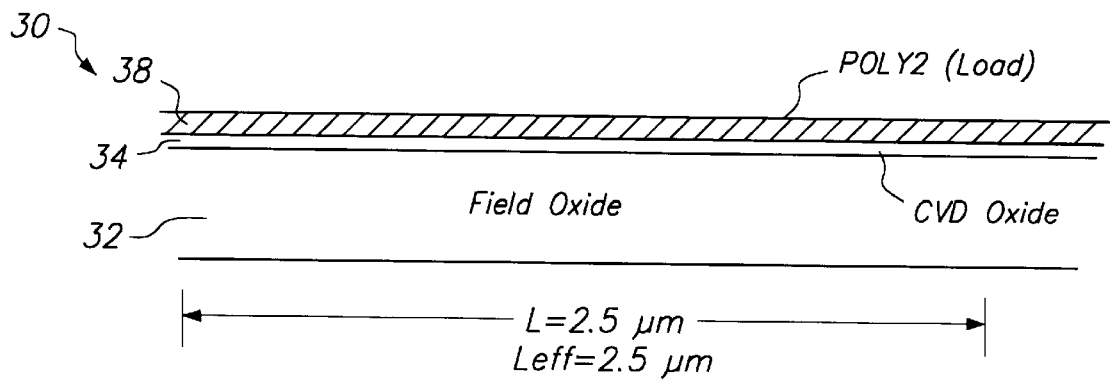
FIG. 3 illustrates a cross section of the length dimension of a resistance sheet of polysilicon of the prior art.

The poly 2 rails 44a and 44b extend in a vertical direction above the substrate, thereby extending the effective length of the resistance sheet 52 formed over the poly 2 rails 44a and 44b. The effective length of the resistance sheet 52 includes the length of the substantially vertical and horizontal components. The length of the resistance sheet illustrated in FIGS. 4 and 5 is 2.5 micrometers, which is the same length as the resistance sheet 38 of FIG. 3. However, because the resistance sheet 52 of the present invention is formed over the poly 2 rails 44a and 44b and includes substantially vertical components as well as substantially horizontal components, the effective length of the resistance sheet 52 is equal to 4.5 micrometers. This increases the L/W ratio of the resistance sheet 52 as compared to the flat sheet 38 of the prior art and thereby also increases the resistance value of the resistance sheet 52. Accordingly, in the same overall length as the resistance sheet 38, the resistance sheet 52 of the present invention has a greater effective length due to the extension of the resistance sheet 52 in the vertical direction over the poly 2 rails 44a and 44b.

Figure 6:
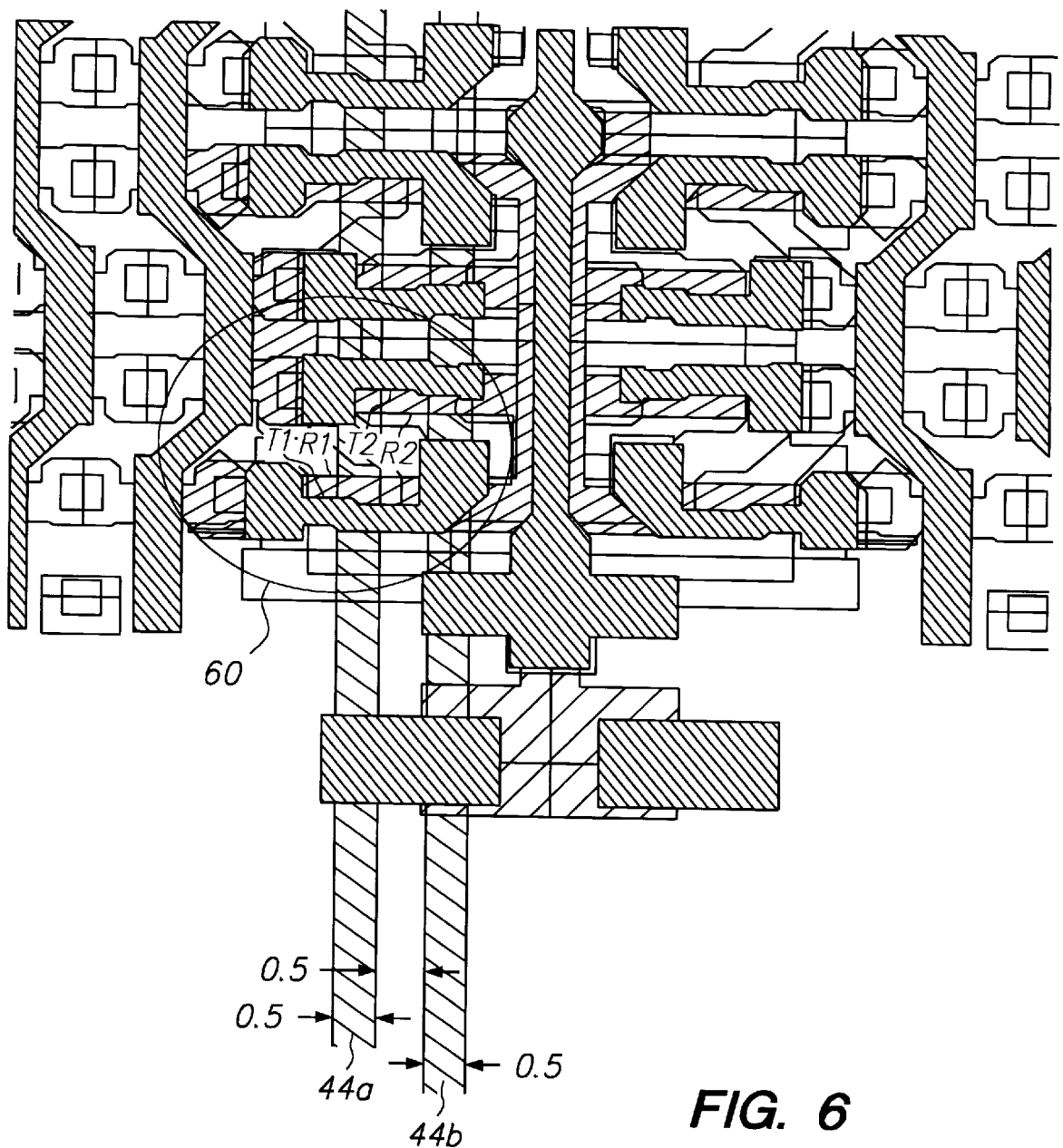
FIG. 6 illustrates a top plan view of a layout of a portion of an SRAM array of the preferred embodiment of the present invention.

A top plan view of a layout of a portion of an SRAM array of the preferred embodiment of the present invention is illustrated in FIG. 6. A memory cell 60 includes the structures which form the transistors T1 and T2 and the resistors R1 and R2. The resistive sheets forming the resistors R1 and R2 are formed over the poly 2 rails 44a and 44b, thereby increasing the effective length and the resistance value of the resistive sheets in the same overall area as conventional memory cells.

As described above, the preferred embodiment of the present invention includes two poly 2 rails 44a and 44b. However, as should be apparent to those skilled in the art, any appropriate number of poly 2 rails can be used to increase the effective length of the resistance sheet 52 within a fixed area. Also, the poly 2 rails can be formed to have any appropriate vertical and horizontal dimensions in order to achieve the necessary resistance value within the corresponding area.

An SRAM array according to the present invention includes resistance sheets formed over poly 2 rails in order to obtain a greater effective length of the resistance sheet within a corresponding fixed area. The effective length of a resistance sheet of the present invention is greater than the length within which the resistance sheet is contained. The greater effective length is achieved because the resistance sheet is formed over the poly 2 rails and therefore includes vertical components. The greater effective length yields a greater L/W ratio and thereby achieves a greater resistive value for the resistance sheet within the fixed area. Accordingly, greater values for the current limiting devices within the SRAM cells of the array are achieved without increasing the overall dimensions of the array. Also, resistance sheets within a higher dopant concentration can be used to obtain a greater resistance value due to the increased L/W ratio. This requires a lower activation energy and leads to higher reliability and less manufacturing problems.

The present invention has been described in terms of specific embodiments incorporating details to facilitate the understanding of principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. A resistance device comprising:
   a. one or more vertical area enhancing structures extending in a vertical direction with respect to a support surface on which the resistance device is built; and
   b. a resistance sheet formed over the one or more vertical area enhancing structures, thereby including horizontal components and vertical components, wherein a effective length of the resistance sheet including a length of the horizontal components and vertical components is greater than a length of the resistance sheet in a single plane.

2. The resistance device as claimed in claim 1 wherein the one or more vertical area enhancing structures are formed from polysilicon.

3. The resistance device as claimed in claim 1 wherein the resistance sheet is formed from doped polysilicon.

4. The resistance device as claimed in claim 1 wherein the support surface is a substrate.

5. The resistance device as claimed in claim 1 wherein the one or more vertical area enhancing structures are formed on a field oxide layer.

6. A memory cell including a plurality of transistors and a corresponding plurality of current limiting devices for storing a value within the memory cell, wherein each of the current limiting devices comprises:
   a. one or more rail structures extending in a vertical direction with respect to a support surface; and
   b. a resistance sheet formed over the one or more rail structures, thereby including horizontal components and vertical components.

7. The memory cell as claimed in claim 6 wherein the memory cell is a static random memory cell within an array of memory cells.

8. The memory cell as claimed in claim 6 wherein an effective length of the resistance sheet is greater than a length of the resistance sheet in a single plane.

9. The memory cell as claimed in claim 6 wherein the one or more rail structures are formed from polysilicon.

10. The memory cell as claimed in claim 6 wherein the resistance sheet is formed from doped polysilicon.

11. A static random access memory (SRAM) array comprising:
    a. a substrate; and
    b. a plurality of SRAM cells formed on the substrate and arranged within a plurality of rows disposed in a row direction and a plurality of columns disposed in a column direction to form an array, each of the SRAM cells having a pair of cross-coupled, active devices and a corresponding pair of current limiting devices, wherein each of the current limiting devices include:
       i. at least one vertical area enhancing structure extending in a vertical direction with respect to the substrate; and
       ii. a resistance sheet formed over the vertical area enhancing structure, thereby including horizontal components substantially parallel to the substrate and vertical components substantially perpendicular to the substrate.

12. The SRAM array as claimed in claim 11 wherein a word line is associated with each of the rows.

13. The SRAM array as claimed in claim 11 wherein the vertical area enhancing structure is formed from a layer of polysilicon.

14. The SRAM array as claimed in claim 11 wherein the vertical area enhancing structure is formed on a field oxide layer.

15. The SRAM array as claimed in claim 11 wherein an effective length of the resistance sheet including a length of the horizontal components and the vertical components is greater than a length of the resistance sheet in a single plane.

16. The SRAM array as claimed in claim 11 wherein the resistance sheet is formed from doped polysilicon.

17. A method of fabricating a static random access memory cell (SRAM) including a pair of cross-coupled transistors and a corresponding pair of current limiting devices, comprising the steps of:
    a. forming one or more vertical area enhancing structures extending in a vertical direction with respect to the substrate; and
    b. forming a resistance sheet for each current limiting device, over the vertical area enhancing structures, wherein an effective length of the resistance sheet is greater than a length of the resistance sheet.

18. The method as claimed in claim 17 wherein the effective length includes a length of horizontal and vertical components of the resistance sheet.

19. The method as claimed in claim 17 wherein the vertical area enhancing structure is formed from a layer of polysilicon.

20. The method as claimed in claim 17 wherein the resistance sheet is formed from doped polysilicon.

21. The method as claimed in claim 17 wherein the vertical area enhancing structures are formed on a field oxide layer.

* * * * *